United States Patent
Maiz et al.

(10) Patent No.: US 6,794,755 B2
(45) Date of Patent: Sep. 21, 2004

(54) SURFACE ALTERATION OF METAL INTERCONNECT IN INTEGRATED CIRCUITS FOR ELECTROMIGRATION AND ADHESION IMPROVEMENT

(75) Inventors: Jose A. Maiz, Portland, OR (US); Xiaorong Morrow, Portland, OR (US); Thomas Marieb, Portland, OR (US); Carolyn Block, Portland, OR (US); Jihperng Leu, Portland, OR (US); Paul McGregor, Hillsboro, OR (US); Markus Kuhn, Hillsboro, OR (US); Mitchell C. Taylor, Lake Oswego, OR (US)

(73) Assignee: Intel Corporation, Santa Clara, CA (US)

(*) Notice: Subject to any disclaimer, the term of this patent is extended or adjusted under 35 U.S.C. 154(b) by 12 days.

(21) Appl. No.: 10/400,128

(22) Filed: Mar. 25, 2003

(65) Prior Publication Data

US 2004/0056329 A1 Mar. 25, 2004

Related U.S. Application Data

(62) Division of application No. 10/255,416, filed on Sep. 25, 2002.

(51) Int. Cl.[7] .................. H01L 23/48; H01L 23/52; H01L 29/40

(52) U.S. Cl. .................. 257/758; 257/761; 257/767
(58) Field of Search .................. 438/629, 637, 438/638, 648, 653, 656, 660, 672, 675, 687, 688; 257/774, 758, 759, 761, 763, 764, 765, 766, 767, 771

(56) References Cited

U.S. PATENT DOCUMENTS

| | | | | |
|---|---|---|---|---|
| 6,147,000 A | * | 11/2000 | You et al. | .................. 438/687 |
| 6,268,291 B1 | | 7/2001 | Andricacos et al. | |
| 6,342,444 B1 | | 1/2002 | Higashi et al. | |
| 6,426,289 B1 | | 7/2002 | Farrar | |
| 6,521,523 B2 | * | 2/2003 | Lee et al. | .................. 438/633 |

* cited by examiner

Primary Examiner—Long Pham
Assistant Examiner—Hoai Pham
(74) Attorney, Agent, or Firm—Blakely, Sokoloff, Taylor & Zafman LLP

(57) ABSTRACT

Described is a method and apparatus for altering the top surface of a metal interconnect. In one embodiment of the invention, a metal interconnect and a barrier layer are formed into an interlayer dielectric (ILD) and the metal interconnect and the barrier layer are planarized to the top of the ILD. The top surfaces of the metal interconnect, the barrier layer, and the ILD are altered with a second metal to form an electromigration barrier. In one embodiment of the invention, the second metal is prevented from contaminating the electrical resistivity of the metal interconnect.

6 Claims, 12 Drawing Sheets

SURFACE ALTERATION OF METAL INTERCONNECT IN INTEGRATED CIRCUITS FOR ELECTROMIGRATION AND ADHESION IMPROVEMENT

This Application is a Divisional of U.S. patent application Ser. No. 10/255,416 entitled "SURFACE ALTERATION OF METAL INTERCONNECT IN INTEGRATED CIRCUITS FOR ELECTROMIGRATION AND ADHESION IMPROVEMENT." filed on Sep. 25, 2002.

FIELD

An embodiment of the invention relates generally to the field of semiconductor technology and, more specifically, to the formation of interconnects in an integrated circuit.

BACKGROUND

In the formation of electronic circuitry, electromigration of metal interconnects must be considered. FIG. 1 illustrates a metal interconnect formed according to a conventional technique. Referring to FIG. 1, an interlayer dielectric (ILD) 102 is deposited on an etch-stop layer 104, typically silicon nitride. A via 106 and trench 107 are patterned into the ILD 102 according to well-known dual damascene techniques. A barrier layer 108 may be formed on the bottom and sidewalls of the via 106 and the trench 107. The via 106 and trench 107 are then filled with an electrically conductive material, such as copper and planarized to the top of the ILD 102, thus forming a copper interconnect 110. An etch-stop layer 112, is deposited over the planarized ILD 102, the planarized barrier layer 108, and the planarized interconnect 110. Consequently, a second ILD 114, second barrier layer 118, and second interconnect 116 may be formed, the second barrier layer 118 and second interconnect 116 connecting to the first interconnect 110 to provide electrical connection between interconnects 110 and 116. The process may repeat itself for additional ILD/ interconnect layers.

The typical copper interconnect shown in FIG. 1 suffers from problems. As current flows through the copper interconnect 110, the force of the flowing electrons in the current dislodges copper ions within the interconnect 110, a phenomena generally known as "electromigration". The dislodged copper ions tend to migrate in a direction that has the least resistance to their movement. The interface 120 between the top of the copper interconnect 110 with the bottom of the etch-stop layer 112 is commonly the area of least resistance. In other words, the etch-stop layer 112 does not significantly prevent electromigration at the top of the interconnect 110.

As integrated circuits become smaller in size, interconnects must also become smaller. Consequently, modern interconnects must have higher current densities to maintain proper electrical performance. Unfortunately, the higher that an interconnect's current density increases, so does the tendency to cause electromigration at the top of the interconnect 110. In other words, because of the increased density of modern interconnects, dislodged ions will be even more inclined to seek paths of least resistance than in the past, thus increasing the tendency for electromigration to occur at the top of interconnect 110. Because the top of the interconnect is especially vulnerable to the electromigration effect, modern interconnects are suffering electromigration at the top more severely than in the past.

Some attempts have been made to address this problem, such as doping, cleaning, or roughening the top of the copper interconnect. However these approaches result in limited gains for electromigration performance and low adhesion strengths or tend to contaminate the entire interconnect with a dopant species resulting in a high electrical resistivity.

BRIEF DESCRIPTION OF THE DRAWINGS

The present invention is illustrated by way of example and should not be limited by the figures of the accompanying drawings in which like references indicate similar elements and in which.

DETAILED DESCRIPTION

Described herein is a method and apparatus for altering the surface of a metal interconnect to provide improved electromigration performance and adhesion strength. In the following description numerous specific details are set forth. One of ordinary skill in the art, however, will appreciate that these specific details are not necessary to practice embodiments of the invention. While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art. In other instances well-known semiconductor fabrication processes, techniques, materials, equipment, etc., have not been set forth in particular detail in order to not unnecessarily obscure embodiments of the present invention.

Various methods of forming a metal interconnect are described below that involves treating the top surface of the metal interconnect with a different metal material ("treatment metal") so that the physical composition of the entire top surface of the interconnect metal is altered to form a thin surface barrier having a higher activation energy of electromigration than that of the metal interconnect. The treatment metal may be introduced to the top surface of the interconnect via various techniques (e.g., ion implantation, continuous deposition, selective deposition, etc.).

The treatment metal adheres to the top of the interconnect and alters the physical structure of the top surface of the interconnect, leading to improved electromigration performance. Furthermore, in one embodiment of the invention, the treatment metal is not permitted to substantially contaminate the electrical resistivity of the interconnect. Consequently, a metal interconnect can be formed having an altered top that significantly prevents electromigration, yet at the same time the metal interconnect may substantially maintain a low electrical resistivity.

Figure 1:
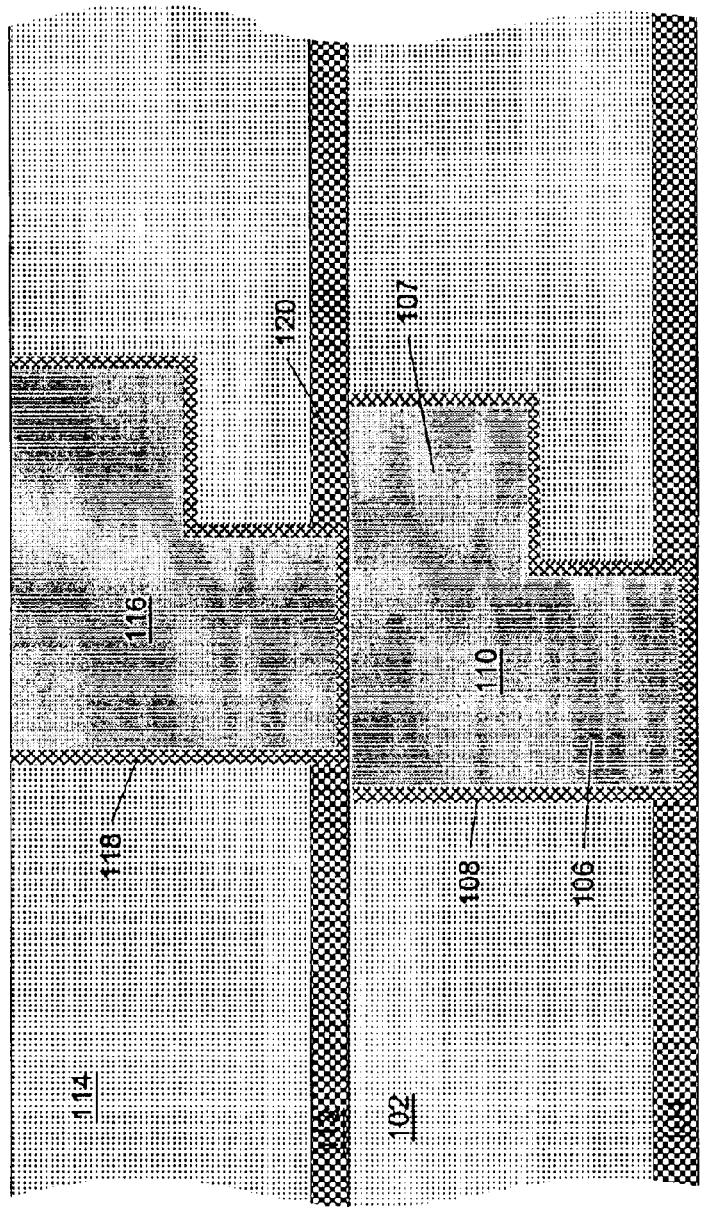
FIG. 1 illustrates a conventional copper interconnect.
Figure 2A:
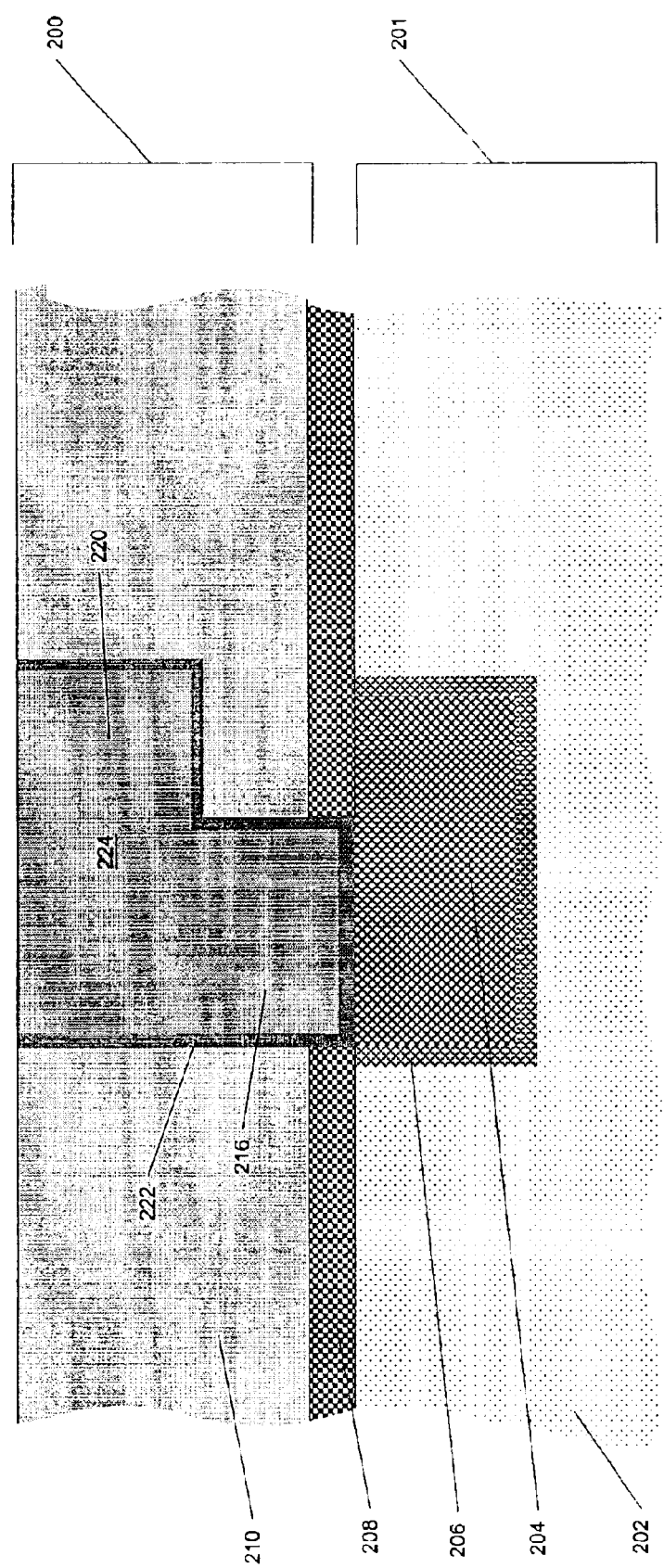
FIGS. 2A–2G illustrate a method according to one embodiment of the invention.

The method begins, as shown in FIG. 2A with the formation of an interconnect layer 200 within an integrated circuit. In one embodiment of the invention, as shown in FIG. 2A, the interconnect layer 200 may formed on a substrate 202 supporting a conductor 204 which may be connected to electronic devices that have been formed into the substrate. The term "substrate" encompasses a semiconductor wafer, such as doped monocrystalline silicon, as well as structures that have one or more insulative, semi-insulative, conductive, or semiconductive layers and materials. The conductor 204 can be a material such as copper, silver, gold, or aluminum, clad in a diffusion barrier 206, such as titanium nitride, tantalum or tantalum nitride.

Still referring to FIG. 2A, the interconnect layer 200 may include a non-conductive etch-stop layer 208, comprising a material such as silicon nitride, silicon oxynitride, silicon carbide, or silicon oxide, formed above the substrate 202 and above the supporting conductor 204. The etch-stop layer 208 is to act as an etch-stop during the formation of an interconnect 224 and a barrier layer 222 within an ILD 210. Upon, the etch-stop layer 208 is formed an insulative layer 210, sometimes referred to as an interlayer dielectric, or ILD for short. The ILD 210 may comprise any material that will electrically isolate metallization (e.g., metal interconnects) formed within the ILD 210. Exemplary materials for the ILD 210 may include oxide compounds (e.g., silicon dioxide ($SiO_2$), fluorine-doped silicon oxide (SiOF), carbon doped oxide (CDO), etc.). The thickness of the ILD 210 may vary depending on the design of the integrated circuit, but in one embodiment of the invention is approximately 6000 Å.

Formed in the ILD 210 may be an electrically conductive interconnect 224 couched in a barrier layer 222. The electrically conductive interconnect 224 and the barrier layer 222 may be formed by any technique known in the art. In the embodiment of the invention shown in FIG. 2A, the interconnect 224 is formed according to dual damascene techniques well known in the art. Other embodiments, however, may utilize single damascene, or other known techniques.

The electrically conductive interconnect 224 may comprise a metal material, such as copper. Copper is an excellent conductor of electricity. Copper has a very high electrical conductivity and a low electrical resistivity. Copper also has many other desirable properties well known in the art. Consequently, in the embodiments of the invention described in detail herein, the electrically conductive interconnect 224 will be referred to as a copper interconnect 224. However, it should be understood that in other embodiment of the invention, other metals may be used in place of copper, such as gold, silver, and aluminum.

The barrier layer 222 is formed on the sidewalls and bottom of a via 216 and trench 220 and may comprise an exemplary conductive material such as zirconium nitride, titanium nitride, tantalum nitride, tungsten nitride, hafnium nitride, or other materials and compounds that will significantly prevent copper diffusion along the sides and bottom of the via 216 and trench 220.

As shown in FIG. 2A, the ILD 210, the copper interconnect 224 and the barrier layer 222 are planarized via a planarization procedure, such as a chemical mechanical polish ("CMP"). The planarization procedure exposes the top surfaces of the ILD 210, the interconnect 224, and the barrier layer 222.

Figure 2B:
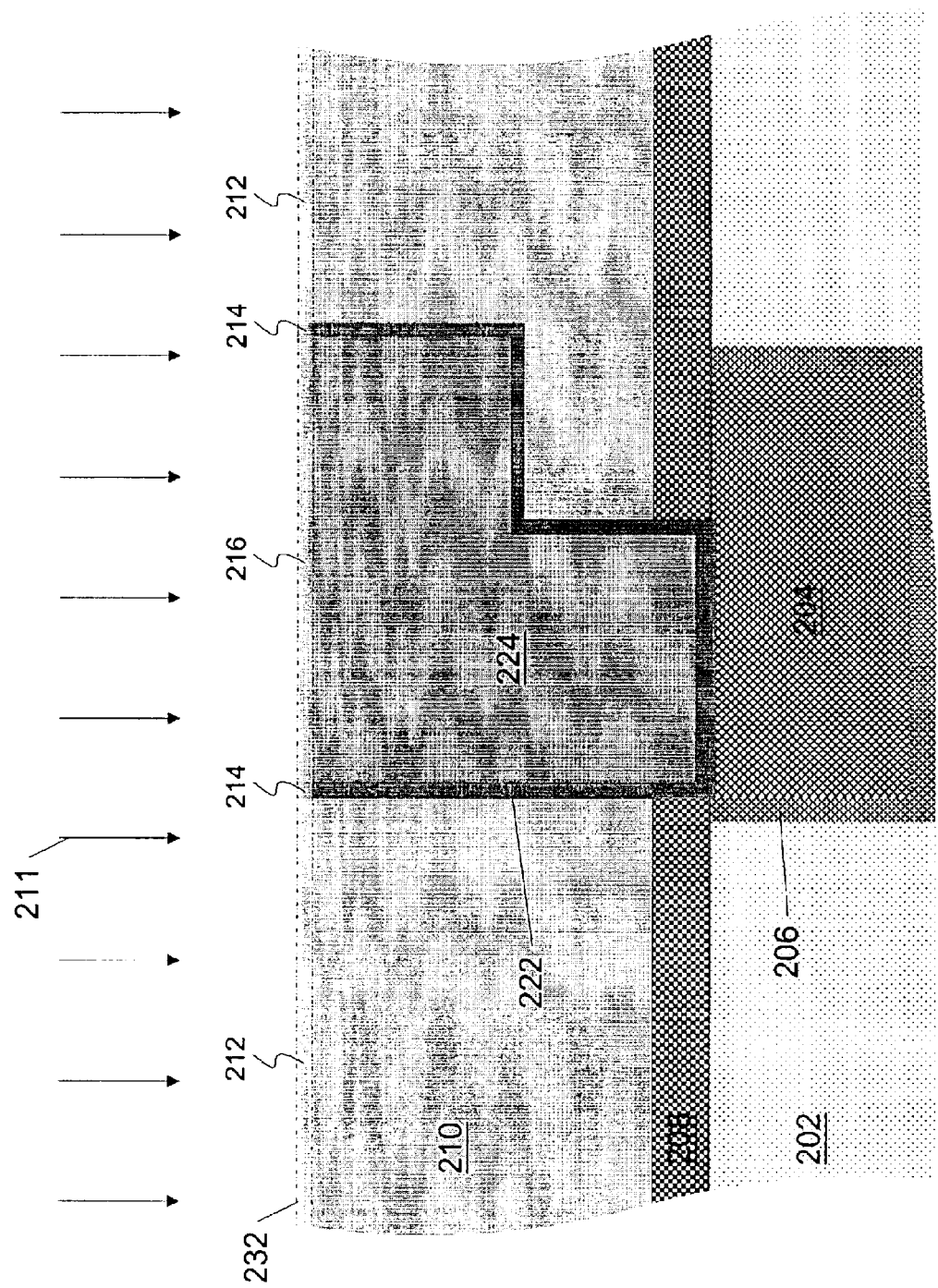

Next, according to one embodiment of the invention as shown in FIG. 2B, the exposed top surfaces of the ILD 210, the interconnect 224, and the barrier layer 222 are treated with a metal material 211 ("treatment metal") via an ion implantation procedure. Ion implantation includes converting the treatment metal 211 into ionic form, also known as a species, accelerating the species and inserting the species at a particular dose and energy to a particular depth into the exposed top surfaces of the ILD 210, the interconnect 224, and the barrier layer 222 to form a treatment-metal layer 232. The portion 212 of the treatment-metal layer 232 along the top surface of the ILD 210 includes a mixture of ILD 210 material and the treatment metal 211 (i.e., the "ILD mixture 212"). The portion 214 of the treatment-metal layer 232 along the top surface of the barrier layer 222 includes an alloy of the barrier layer 222 material and the treatment metal 211 (i.e., the "barrier alloy 214"). The portion 216 of the treatment-metal layer 232 along the top surface of the copper interconnect 224 includes an alloy of the copper interconnect 224 and the treatment metal 211 ("copper alloy 216"). Ions from the treatment metal 211 displace copper ions in the copper grain of the interconnect 224 to form the copper alloy 216. The copper alloy 216, therefore, is to act as an electromigration barrier along the entire top surface of the copper interconnect 224. In addition, the barrier alloy 214 may act as a diffusion barrier along the entire top surface of the barrier layer 222. The copper alloy 216 contains treatment metal ions that, displace the original copper ions in the copper grain.

The treatment metal 211 should comprise a conductive material that will adhere to top surface of the copper interconnect 224 and alter its physical composition thus causing an increase in the activation energy of electromigration (diffusion) of copper. In other words, the treatment metal 211 should comprise a material that will alter the molecular structure of the top of the copper interconnect 224, thus increasing the reaction energy necessary to cause electromigration. In one embodiment, high reactivity metals such as aluminum, titanium, tantalum, chromium, cobalt or others, are used in the metal treatment implant. These highly reactive metals produce a strong chemical bonding to the copper molecules as well as to any subsequently formed etch-stop layers, increasing the adhesion strength of the copper interconnect 224, thus effectively making the movement of copper ions difficult along the interface between the copper interconnect 224 and any subsequently formed etch-stop layers. A good measure of the improved electromigration is provided by the increase in the activation energy for the diffusion process. Conventional implementations of a copper interconnect to a conventional etch stop layer interfaces results in activation energies in the order of 0.80–0.85 electron-Volts (eV). The implementation of the treatment metal 211 increases that activation energy to values in the range of approximately 1.0 to 1.2 eV, thus significantly increasing the electromigration resistance. In addition, according to some embodiments of the invention described herein, the treatment metal 211 may also be a metal material that will readily oxidize in the presence of an oxygen environment. Exemplary treatment metals 211 include tantalum (Ta), titanium (Ti), aluminum (Al), chromium (Cr), and cobalt (Co).

As mentioned previously, copper has a relatively low resistivity to current flow compared to most metals, thus allowing it to have excellent conductive properties. Low resistivity is important to maintain so that circuitry connected to the copper interconnect 224 will receive sufficient electrical current during operation with minimal power consumption. However, as it is commonly known to those ordinarily skilled in the art, the contamination of copper with other metals significantly increases the electrical resistivity of copper even when alloyed in small amounts. Therefore, it would be disadvantageous to allow the treatment metal 211 to pervade ("contaminate") the copper interconnect 224 to a degree that will significantly increase the low electrical resistivity of the copper or decrease the high electrical conductivity of the copper.

Several techniques may be employed, according to various embodiments of the invention, to limit the degree that the treatment metal 211 will contaminate the copper interconnect 224. For example, one technique includes implanting the treatment metal 211 to a very limited depth, preferably only to a few angstroms thick. The limited depth ensures that the electrical resistivity of the copper alloy 216, even if high, has a negligible impact in the overall resistivity of the entire copper interconnect 224. In one embodiment of the invention, the implantation process may utilize a low energy, approximately between 1 keV to 6 keV, which would result in the treatment metal 211 being implanted to a depth of approximately 2 Å to 50 Å.

Another technique for limiting the degree that the treatment metal 211 will contaminate the electrical resistivity of the copper interconnect 224 is to utilize a low ion dosage during implantation. Thus, if the treatment metal 211 diffuses into the copper interconnect 224, the low dosage of treatment metal 211 ions will limit the actual number of ions in the copper interconnect 224, thus decreasing the possible affect on the electrical resistivity of the copper interconnect 224. In one embodiment, a low dose of ions may be applied to approximately $1 \times 10^{15}$ ions/cm$^2$ to $3 \times 10^{16}$ ions/cm$^2$.

A low dose of ions is advantageous to limit contamination of the copper interconnect 224, but also has an added advantage of ensuring that the ILD mixture 212 will be substantially non-conductive. For example, if the treatment metal 211 is implanted to a low dosage of ions, the treatment metal 211 will not be concentrated enough within the ILD mixture 212 to conduct electricity. It is important that the ILD mixture 212 be non-conductive since the function of the ILD 210 is to provide electrical isolation between interconnecting circuit elements. In the embodiment of the invention shown in FIG. 3B, the ILD 210 comprises an oxygen bearing material (e.g., SiO$_2$, SiOF, CDO, etc.) from which the treatment metal 211 may tend to draw oxygen causing an oxidation of the ILD mixture 212. Oxidation of the treatment metal 211 within the ILD mixture 212 may occur immediately upon contact with the treatment metal 211 or via the encouragement of a subsequent thermal treatment. Oxidation of the ILD mixture 212 further ensures that the ILD mixture 212 will be non-conductive.

Another technique for limiting the degree that the treatment metal 211 will contaminate the electrical resistivity of the copper interconnect 224 is to select a material for the treatment metal 211 that has a low diffusivity in copper. Thus, the treatment metal 211 would be confined as much as possible to the very top of the copper interconnect 224 and will not significantly increase the resistivity of the entire copper interconnect 224. For example, some metal materials, such as tantalum and titanium, diffuse very shallowly into copper. Thus, if a highly resistive material having a low diffusivity to copper is used for the treatment metal 211, then the likelihood of significantly increasing the copper's resistivity will be low since the treatment metal 211 would not tend to diffuse much. Tantalum, for example, may diffuse at most to around 10 to 20 Å in depth. Compared to the depth of the copper interconnect 224, which is in the thousands of angstroms, the degree of diffusivity is very low, and consequently, would not significantly increase the resistivity of the copper interconnect 224. Titanium is slightly more diffusive than tantalum (i.e., titanium diffuses approximately 50 Å to 100 Å into copper) but not enough to significantly interfere with the resistivity of the entire copper interconnect 224. On the other hand, some treatment metals, such as aluminum may have a high diffusivity to copper and a stabilization or oxidation may be required to prevent its diffusion, such as by a thermal treatment.

A thermal treatment may be performed to limit a highly diffusive treatment metal (e.g., Al) from substantially diffusing into the copper interconnect 224. A thermal treatment is also advantageous for a treatment metal 211 that is not highly diffusive (e.g., Ti, Ta, etc.), since the thermal treatment helps to adhere the treatment metal 211 tightly to the top of the copper interconnect 224 whether the treatment metal 211 is highly diffusive or not.

Figure 2C:
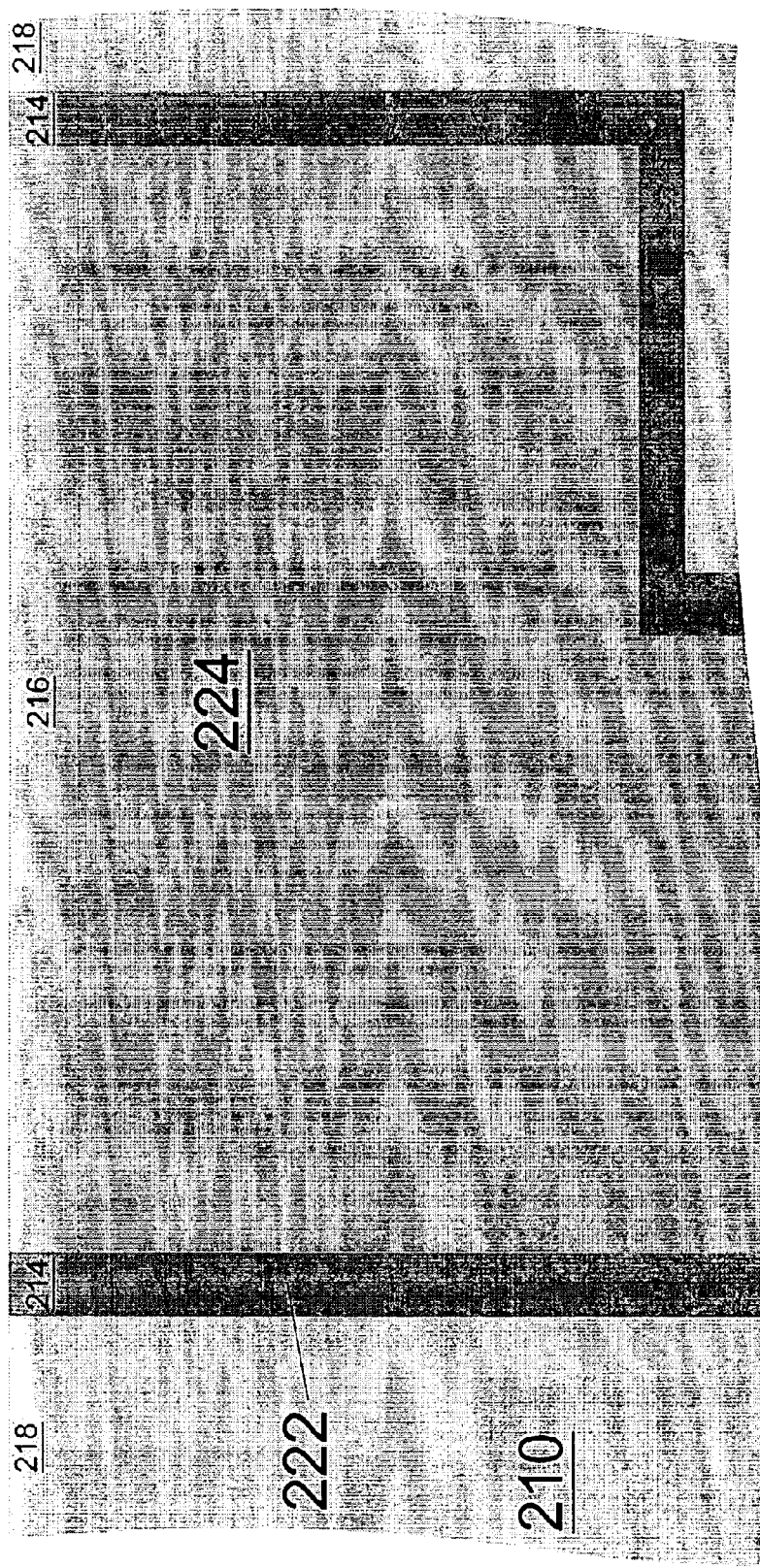

Consequently, the method may continue, as shown in FIG. 2C, with performing a thermal treatment at a low temperature, approximately between 350° C.–400° C., for approximately 30 minutes. As shown in FIG. 2C, the thermal treatment may cause the treatment metal 211 in the lower portions of the copper alloy 216 to diffuse slightly downward, though not significantly thus slightly increasing the depth of the copper alloy 216 into the top of the copper interconnect 224. Consequently, the copper alloy 216 may have a gradient composition ranging from a level of higher concentration of the treatment metal 211 at the top of the copper alloy 216 that becomes progressively lower as the copper alloy 216 transitions downward into the pure copper interconnect 224. The thermal treatment causes the treatment metal 211 to form tight molecular bonds with the copper within the copper alloy 216 and in the surface of the copper interconnect 224. The strong bonding of copper to the treatment metal at the surface increases the activation energy of electromigration, or in other words, the energy needed to cause electromigration within the copper alloy 216, further improving the electromigration properties of the copper alloy 216.

Additionally, as shown in FIG. 2C, because the barrier layer 222 comprises a conductive metal or metal alloy (e.g., titanium nitride, tantalum nitride, tantalum, tungsten nitride, etc.), the treatment metal 211 will also diffuse slightly downward into the barrier layer 222 during the implantation process or during the thermal treatment while solidifying the treatment metal 211 in place. After the thermal treatment, just as for the copper alloy 216, the barrier alloy 214 may have a gradient composition ranging from a level of higher concentration of the treatment metal 211 at the top of the barrier alloy 214 that becomes progressively lower as the barrier alloy 214 transitions downward into the pure barrier layer material 222.

Furthermore, after the thermal treatment the treatment metal 211 in the ILD mixture 212 may become oxidized. As previously mentioned, the ILD material 210 comprises a material having some form of oxygen therein (e.g., SiO$_2$, SiOF, CDO, etc.) and the treatment metal 211 comprises a material that has a very strong tendency to oxidize (e.g., Ta, Ti, Co, Al, Cr, etc.). Therefore, the thermal treatment may encourage the implanted treatment metal 211 to draw oxygen from the ILD 210 and to oxidize the ILD mixture 212. Consequently, as shown in FIG. 2C, the ILD mixture 212 is converted into a mixture 218 ("ILD metal-oxide mixture 218") of the oxidized treatment metal (e.g., tantalum oxide (e.g., TaO, TaO$_2$, Ta$_2$O$_5$), titanium oxide (e.g., TiO, TiO$_2$, Ti$_2$O$_3$, Ti$_3$O$_5$), cobalt oxide (e.g., CoO, CO$_3$O$_4$), chromium oxide (Cr$_2$O$_3$), or aluminum oxide (Al$_2$O$_3$)) with the product of the ILD material 210 after the oxygen has been removed (e.g., Si, F, C, etc.).

Figure 2D:
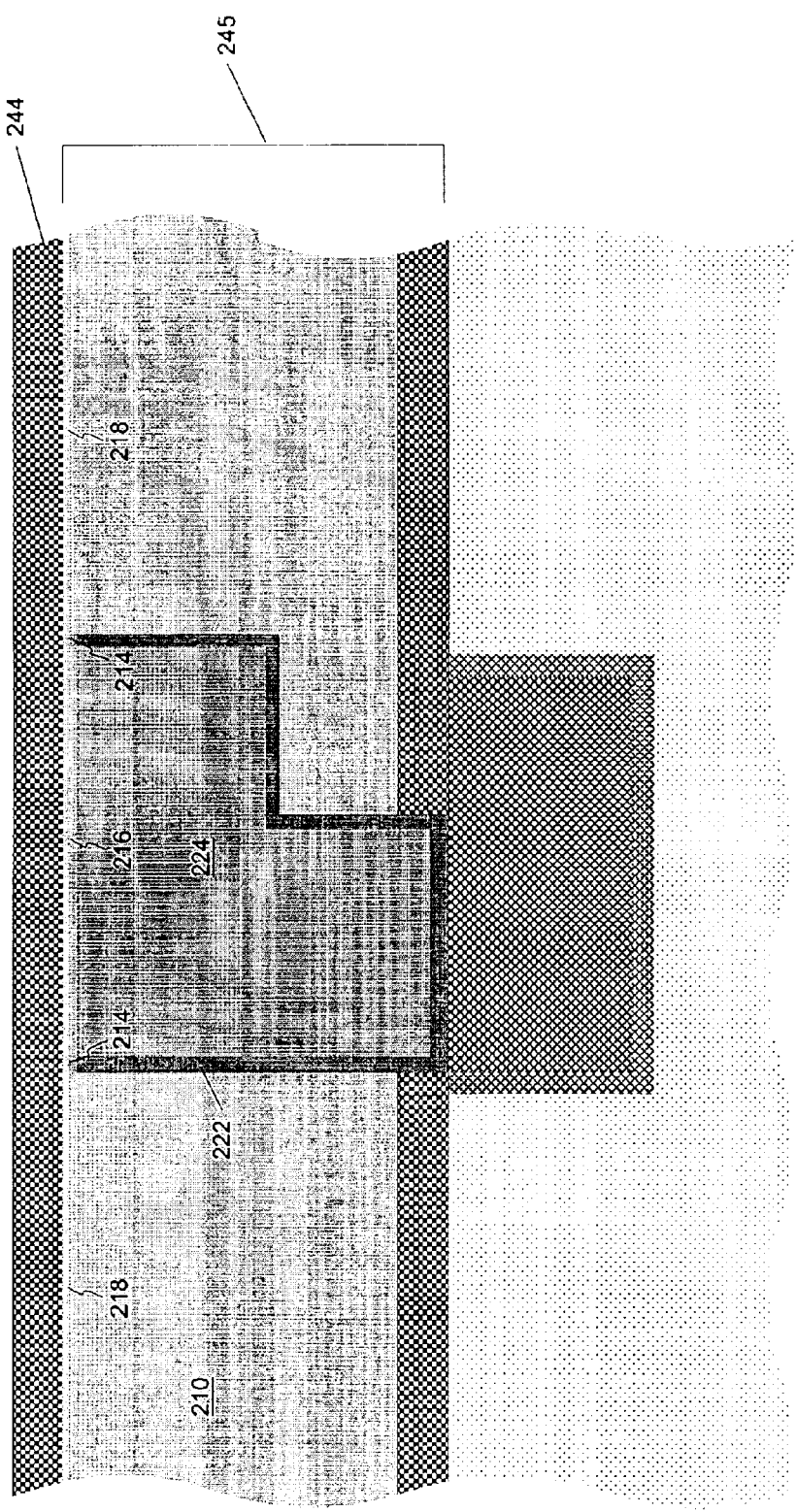

Thus, as shown in FIG. 2D, the method has produced a first interconnect layer 245 with a copper interconnect 224 having a treated top, to significantly prevent electromigration, but that has significantly maintained its low electrical resistivity. Additional processing procedures may continue to form other structures and interconnect layers above the first interconnect layer 245. For example, as shown in FIG. 2D, the method may continue with forming an etch-stop layer 244 over the first interconnect layer 245. The etch-stop layer 244 may include any suitable material that may act to protect the copper alloy 216, barrier alloy 214, and ILD metal-oxide mixture 218 as well as the copper interconnects 224 during subsequent etch and cleaning procedures. Furthermore, the etch-stop layer 244 should be non-conductive to prevent shorting between circuit elements. Exemplary materials that may be suitable for the etch-stop layer 244, therefore, may include silicon nitride (SiN), silicon oxynitride (SiON), boronitride (BN), silicon boronitride (SiBN), or silicon carbide (SiC). The etch-stop layer 244 should be formed to a thickness that will adequately act to stop etchant and cleaning chemicals, but should not be too thick so that it introduces significant capacitance to interfere with the circuit's performance. In one embodiment, the etch-stop layer 244 may be deposited to a thickness of approximately between 50 to 80 nanometers.

Figure 2E:
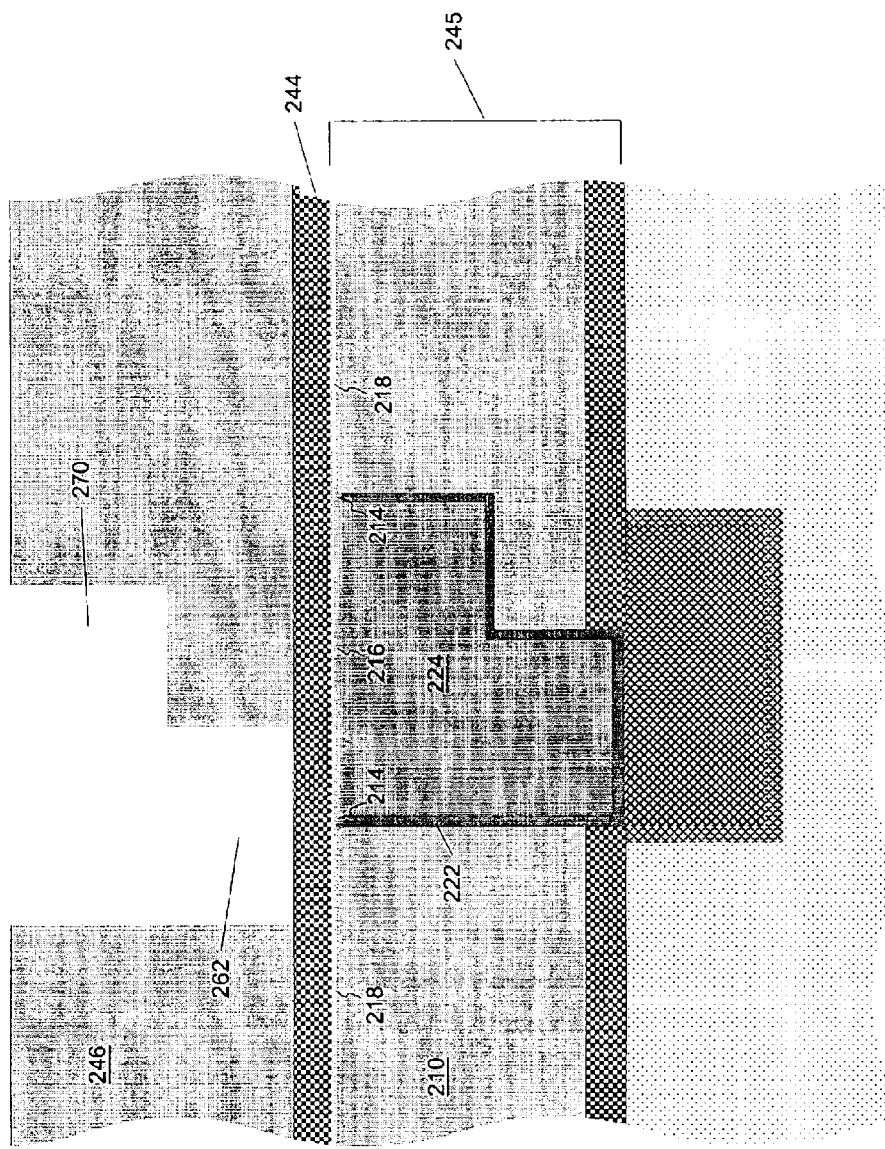

The method may continue, as shown in FIG. 2E, with depositing a second ILD 246 on the etch-stop layer 244, then patterning the second ILD 246 according to known dual damascene techniques, to form a second via 262 and a second trench 270 in the second ILD 246. The second ILD 246 may comprise the same material as the first ILD 210 or the second ILD 246 may be a different material from the first ILD 210. In one embodiment of the invention, the second via 262 may be formed according to an unlanded via design wherein the second via 262 overlies the ILD metal-oxide mixture 218, the barrier alloy 214, and the copper alloy 216. During the formation of the second via 262 and the second trench 270 the etch-stop layer 244 protects the ILD metal-oxide mixture 218, the barrier alloy 214, and the copper alloy 216 from etch and clean processes.

Figure 2F:
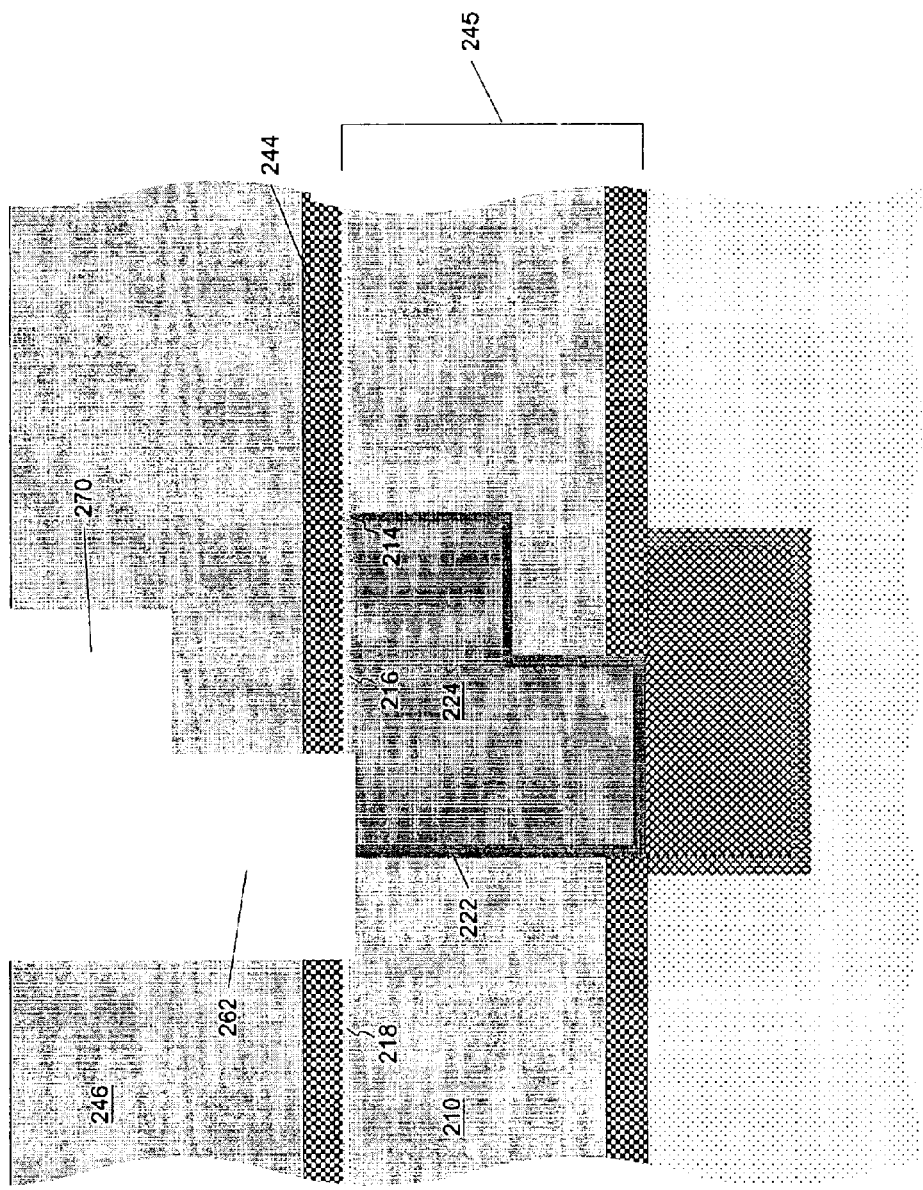

In one embodiment of the invention, as shown in FIG. 2F, the method may continue with etching the etch-stop layer 244 to extend the second via 262 down to the underlying ILD 210, barrier layer 222, and interconnect 224. Thus, the vertical etch of the etch-stop layer 244 may utilize a chemistry that etches the etch-stop layer 244, ILD metal-oxide mixture 218, barrier alloy 214 and copper alloy 216, but does not etch the underlying ILD 210, copper interconnect 224, or barrier layer 222. In another embodiment of the invention, however, the etch need not extend through the barrier alloy 214, copper alloy 216 or the ILD metal-oxide mixture 218, hence an etchant may be utilized that etches the etch-stop layer 244 but does not significantly etch the barrier alloy 214, copper alloy 216 or the ILD metal-oxide mixture 218.

Figure 2G:
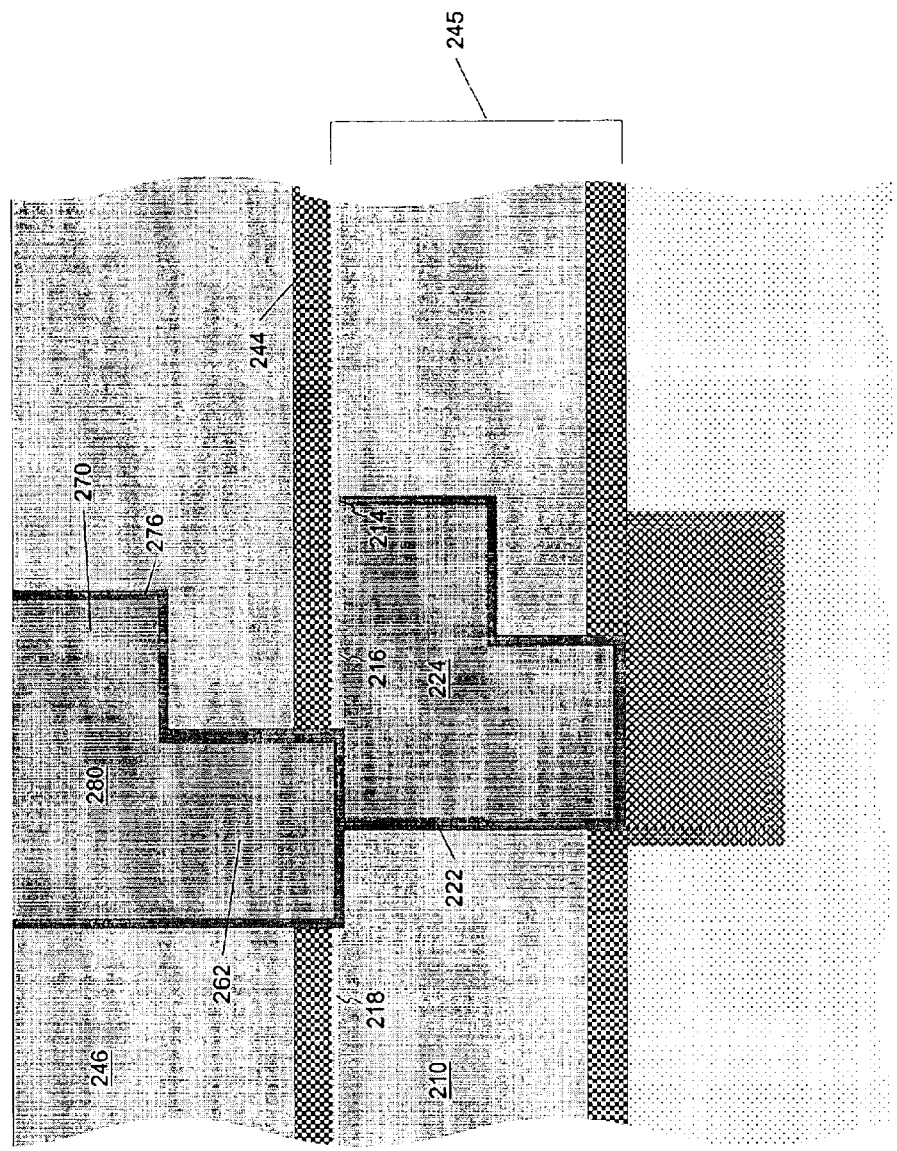

Next, as shown in FIG. 2G, a second interconnect 280 and a second barrier layer 276 may be formed in the second via 262 and second trench 270. The second interconnect 280 and barrier layer 276 may be formed according to any known method in the art, including dual-damascene techniques well known in the art. Another ion implantation procedure may be performed to the top surfaces of the second ILD 246, the second barrier layer 276 and the second interconnect 280 according to any of the techniques described above. The method may repeat for the formation of subsequent interconnect layers.

Figure 3A:
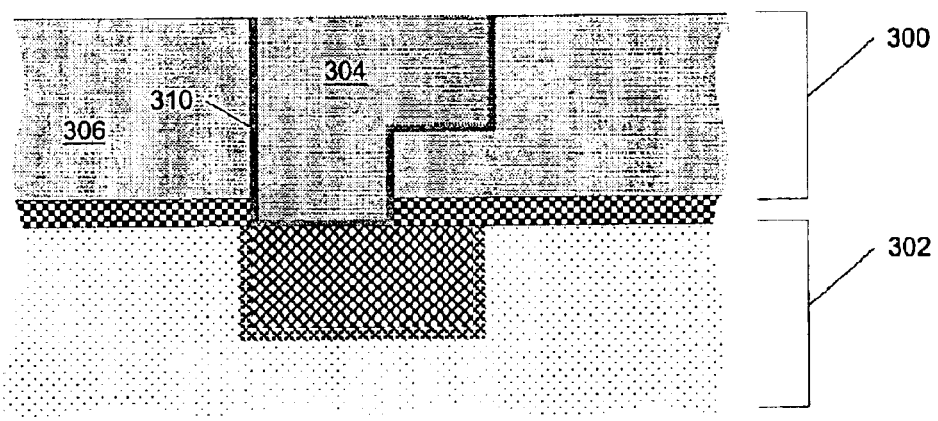
FIGS. 3A–3E illustrate a method according to another embodiment of the invention.

Another embodiment of the invention, depicted in FIGS. 3A–3D, includes a method for altering the top surface of a copper interconnect by method of deposition, as opposed to ion implantation. The method begins with a planarized interconnect layer 300 on an integrated-circuit structure 302, as shown in FIG. 3A. The interconnect layer 300 may be formed in one of many ways known in the art, including well-known dual damascene techniques. The planarized interconnect layer 300 includes an electrically conductive interconnect 304 within an ILD 306. In one embodiment of the invention, the electrically conductive interconnect 304 comprises copper, couched in a barrier layer 310. The barrier layer 310 covers the sides and bottom of the copper interconnect 304, thus preventing the copper from diffusing at the sides and bottom of the copper interconnect 304. The ILD 306 comprises any dielectric material that will provide electrical isolation between circuit elements and electrical lines within the interconnect layer 300. Specifically, in the embodiment shown in FIG. 3A, the ILD comprises an oxygen bearing material (e.g., $SiO_2$, CDO, SiOF, etc.).

Figure 3B:
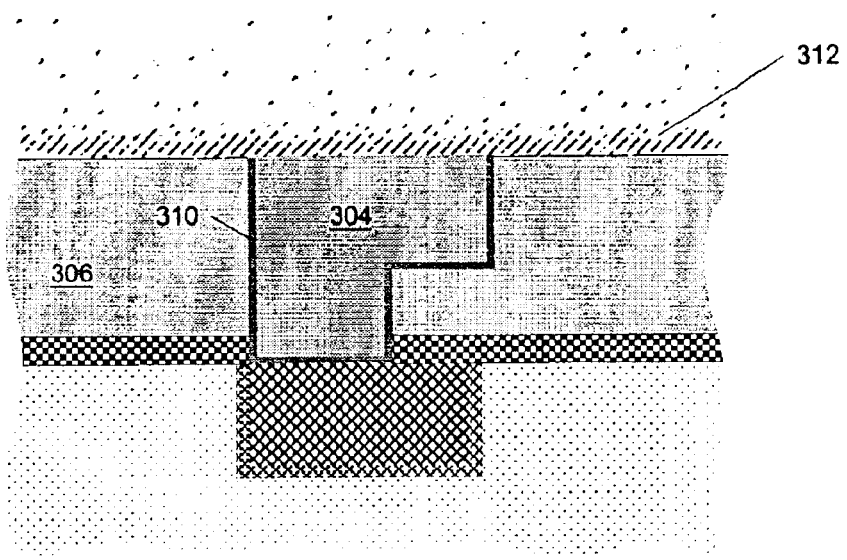

As shown in FIG. 3B, the method continues with treating the exposed top surfaces of the ILD 306, the interconnect 304, and the barrier layer 310 with a metal material 312 ("treatment metal") via any known technique for depositing a thin metal film on a planarized interconnect. Exemplary deposition techniques include sputtering, biased sputtering, chemical vapor deposition (CVD), plasma enhanced CVD, or atomic layer depositions (ALD). In the embodiment of the invention shown in FIG. 3B, the treatment metal 312 is sputter deposited as a continuous film over the interconnect 304, barrier layer 310 and ILD 306. However, the treatment metal 312 does not need to be deposited as a continuous film and instead may be deposited selectively, such as onto only the top surface of the interconnect 304, or onto only the top surfaces of the interconnect 304 and barrier layer 310.

Still referring to FIG. 3B, the treatment metal 312 may be deposited to a thickness approximately between 1 to 10 nanometers (nm). The thickness depends on the type of treatment metal used and the degree of diffusivity into the copper interconnect 304.

Figure 3C:
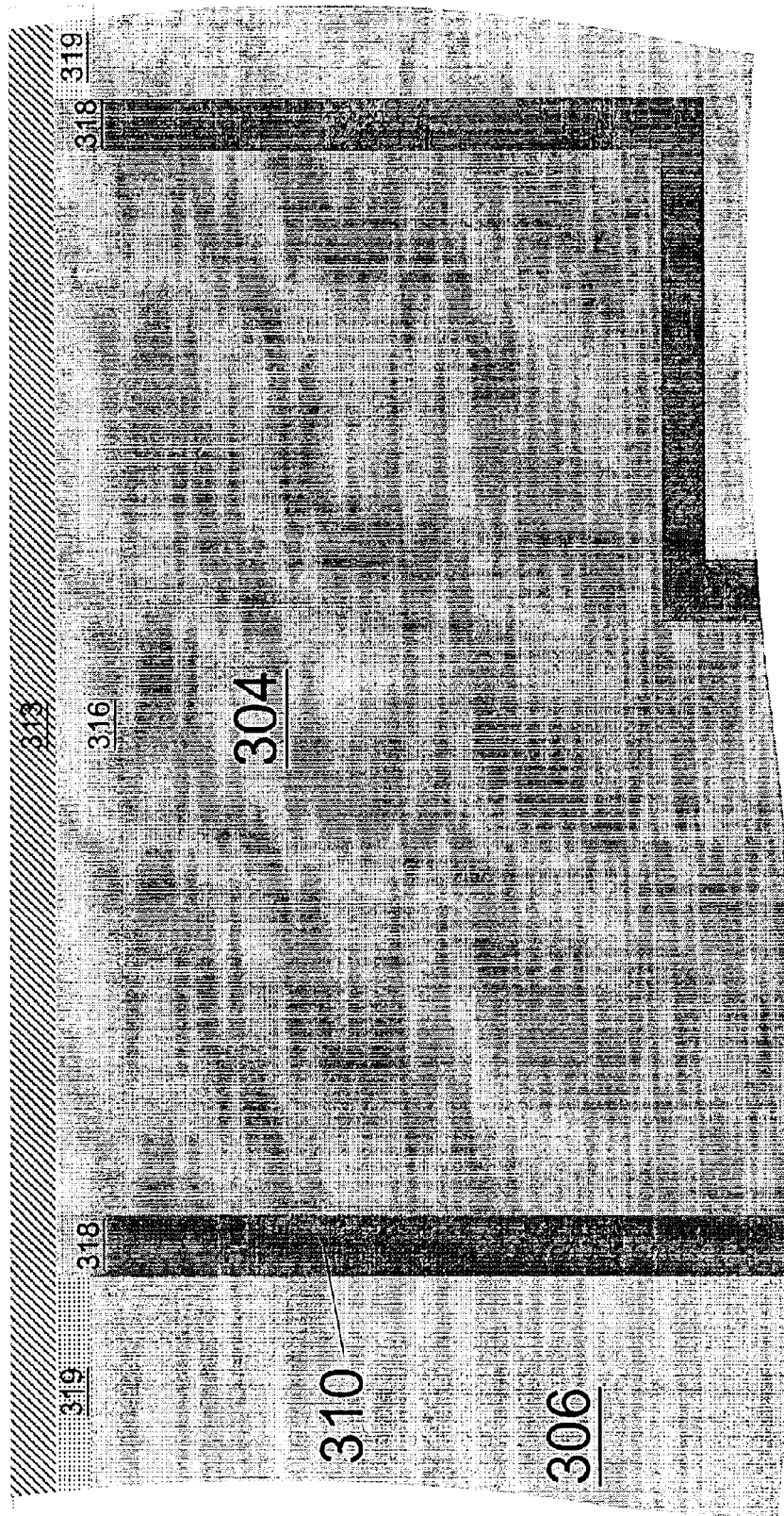

After the deposition process, as shown in FIG. 3C, the resultant structure includes a thin treatment-metal layer 313 consisting of the treatment metal 312. The treatment metal 312 from the treatment-metal layer 313 will diffuse during sequential processing into the top surfaces of the copper interconnect 304 and the barrier layer 310 to form a barrier alloy 318 (i.e., of the barrier layer 310 and the treatment metal 312) and a copper alloy 316 (i.e., of the copper interconnect 304 and the treatment metal 312). The depths of the diffusion will depend on the treatment metal used. Because the ILD 306 comprises an oxygen bearing material, (e.g., $SiO_2$, CDO, SiOF, etc.) and the treatment metal 312 comprises a material (e.g., Ta, Ti, Al, Co., etc.) that has a very strong tendency to oxidize almost immediately upon contact with the ILD 306, the treatment metal 312 may tend to draw oxygen from the ILD 306 causing the treatment metal 312 to oxidize. Hence, a recessed portion 319 ("ILD metal-oxide mixture 319") forms comprising a mixture of the oxidized treatment metal 312 and the product of the ILD 306 that results after the oxygen has been extracted.

The treatment metal 312 should comprise a conductive material that will adhere to top surface of the copper interconnect 304 and alter its physical composition thus causing an increase in the activation energy of electromigration (diffusion) of copper. In addition, the treatment metal 312 may likely comprise a material that has a higher electrical resistivity than copper. Therefore, it would be disadvantageous to allow the copper interconnect 304 to become contaminated by the electrical resistivity of the treatment metal 312.

Hence, various techniques may be employed, according to various embodiments of the invention, to limit the degree that the treatment metal 312 will contaminate the copper interconnect 304. One technique for limiting the degree that the treatment metal 312 may contaminate the copper interconnect 304 is to perform a thermal treatment to the copper alloy 316 to set it in place, thus preventing the treatment metal 312 from significantly diffusing downward into the top of the copper interconnect 304. An exemplary thermal treatment is described in detail further above in conjunction with FIG. 2C. An additional technique may include performing the thermal treatment in an oxygen environment (i.e., an "anneal") causing the treatment metal layer 313 to oxidize.

Figure 3D:
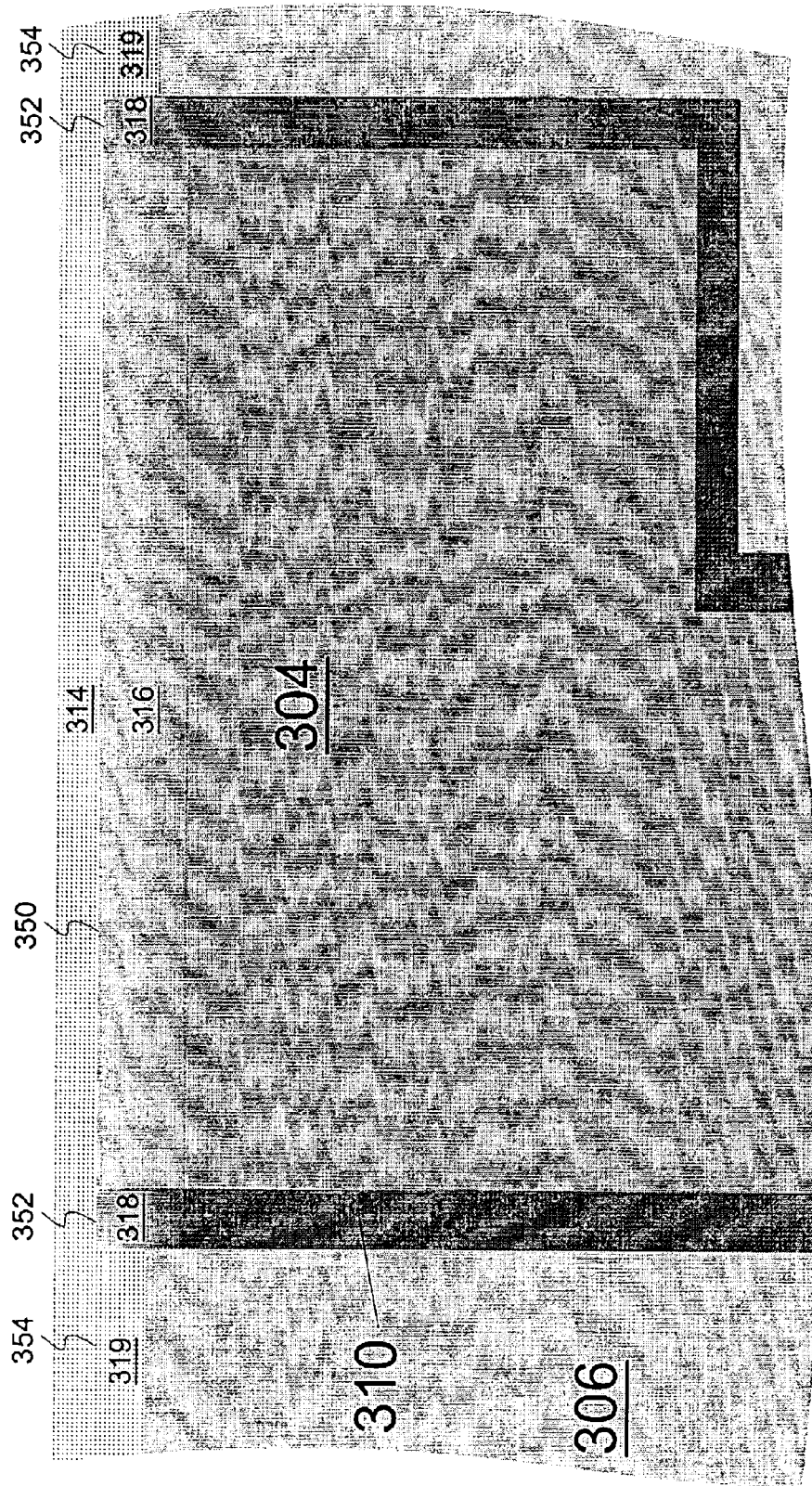

Referring to FIG. 3D, an anneal may be performed at approximately 350° C.–400° C. in an oxygen environment (e.g., $O_2$, $N_2O$, etc.) thus causing the thin treatment-metal layer 313 to react with the oxygen gas and completely oxidize, forming a metal oxide layer 314 over the barrier alloy 318, the copper alloy 316 and the ILD metal-oxide mixture 319. The metal oxide layer 314 may therefore comprise an oxide compound, such as tantalum oxide, titanium oxide, aluminum oxide, chromium oxide, or cobalt oxide. The anneal should be performed until the treatment metal 312 has completely oxidized and becomes completely non-conductive.

During the anneal, the heated environment may cause the treatment metal 312 within the copper alloy 316 to diffuse slightly further into the copper interconnect 304. Thus, the copper alloy 316 adheres to the top of the copper interconnect 304 even more tightly. In addition, during the anneal, the oxidation of the metal-oxide layer 314 may extend slightly into the copper alloy 316 oxidizing the interface 350 between the metal oxide layer 314 and the copper alloy 316. Consequently, the metal-oxide layer 314 may transition smoothly into the copper alloy 316.

In a similar manner, during the anneal, the heated environment may cause the treatment metal 312 within the barrier alloy 318 to diffuse slightly further into the barrier layer 310. The barrier alloy 318 is thus adhered to the top of the barrier layer 310 even more tightly. In addition, during the anneal, the oxidation of the metal-oxide layer 314 may extend slightly into the barrier alloy 318 oxidizing the interface 352 of the treatment metal 312 at the very top of the barrier alloy 318. Consequently, the metal-oxide layer 314 may transition smoothly into the barrier alloy 318.

Still referring to FIG. 3D, the ILD metal-oxide mixture 319 may also have a gradient composition of treatment-metal oxide that transitions downward from a high concentration in the metal-oxide layer 314 to a lower concentration in the ILD metal-oxide mixture 319. Consequently, the interface 354 between the metal-oxide layer 314 and the ILD metal-oxide mixture 319 may be gradual since the metal-oxide layer 314 transitions smoothly into the ILD metal-oxide mixture 319.

Figure 3E:
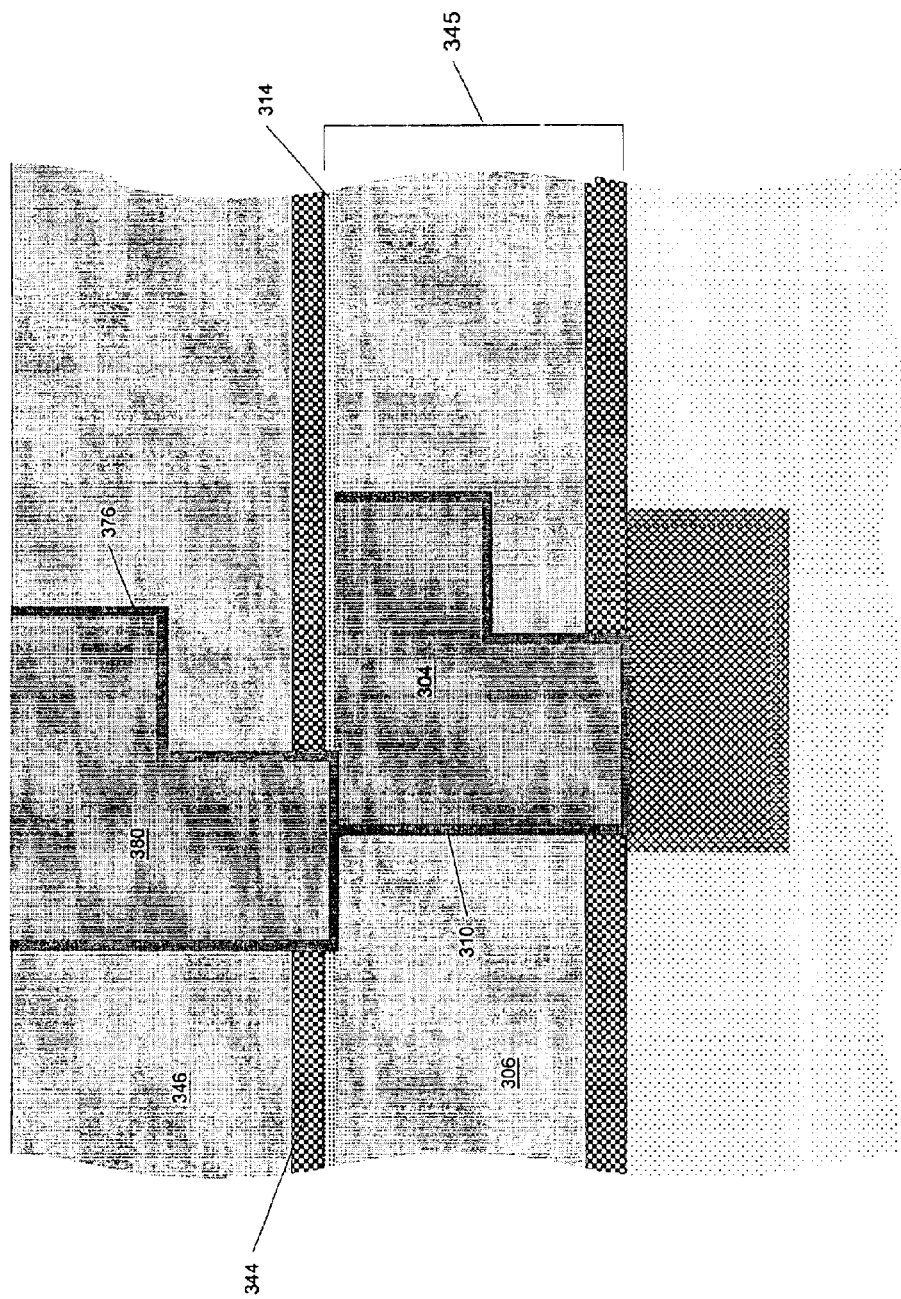

Thus, as shown in FIG. 3E, the method has produced a first interconnect layer 345 with a copper interconnect 304 having a treated top to significantly prevent electromigration along the top of the copper interconnect 304, yet the copper interconnect 304 has significantly maintained its low electrical resistivity. The method may continue, as shown in FIG. 3E, with additional dual-damascene techniques, such as techniques analogous to those described in conjunction with FIGS. 2D–2G above, to form other structures or additional interconnect layers. Referring to FIG. 3E, a second ILD 346 is deposited with a second interconnect 380 and a second barrier layer 376 formed therein. When connecting the second interconnect 380 to the first interconnect 304, the metal-oxide layer 314 should be entirely etched to provide electrical connection between the first interconnect 304 and the second barrier layer 376. In one embodiment of the invention, the etch chemistry may be selected to stop on the copper alloy 316, barrier alloy 318, or ILD metal-oxide mixture 319. In another embodiment of the invention, however, the etch chemistry may be selected to etch through the copper alloy 316, barrier alloy 318, and ILD metal-oxide mixture 319 so that the barrier layer 376 connects directly to the pure copper in the copper interconnect 304.

Several embodiments of the invention have thus been described. However, those skilled in the art will recognize that the invention is not limited to the embodiments described, but can be practiced with modification and alteration within the spirit and scope of the appended claims that follow.

What is claimed:

1. An apparatus, comprising:
    a substrate;
    an interlayer dielectric (ILD) overlaying the substrate;
    an interconnect of a first metal formed into, and planarized to the top of, the ILD; and
    a barrier layer disposed between the interconnect and the ILD, the barrier layer planarized to the top of the ILD, a top surface of the ILD, interconnect, and barrier layer implanted with ions of a second metal such that an electromigration barrier is formed that reduces electromigration at the top surface of the interconnect.

2. The apparatus of claim 1, wherein the first metal comprises copper.

3. The apparatus of claim 1, wherein the top surface includes an alloy of the first metal and the second metal, the alloy having an activation energy of electromigration higher than that of the first metal.

4. The apparatus of claim 3, wherein the second metal comprises any one of titanium, tantalum, cobalt, chromium, or aluminum.

5. The apparatus of claim 1, wherein the top surface of the interconnect includes a metal-oxide layer comprising any one of titanium oxide, tantalum oxide, cobalt oxide, chromium oxide, or aluminum oxide.

6. The apparatus claim 1, wherein the top surface of the interconnect has an activation energy of electromigration approximately between 1.0 to 1.2 eV.

* * * * *